US011747723B2

(12) United States Patent
Mirkin et al.

(10) Patent No.: US 11,747,723 B2
(45) Date of Patent: Sep. 5, 2023

(54) ELECTROCHEMICAL POLYMER PEN LITHOGRAPHY

(71) Applicant: NORTHWESTERN UNIVERSITY, Evanston, IL (US)

(72) Inventors: Chad A. Mirkin, Wilmette, IL (US); Rustin Golnabi, Evanston, IL (US); Eun Bi Oh, Evanston, IL (US); David Alan Walker, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 17/585,316

(22) Filed: Jan. 26, 2022

(65) Prior Publication Data

US 2022/0236641 A1 Jul. 28, 2022

Related U.S. Application Data

(60) Provisional application No. 63/142,829, filed on Jan. 28, 2021.

(51) Int. Cl.
*G03F 7/00* (2006.01)
*B29C 33/38* (2006.01)
*C25D 5/02* (2006.01)
*C25D 17/00* (2006.01)
*C25D 17/12* (2006.01)

(52) U.S. Cl.
CPC ............ *G03F 7/0002* (2013.01); *B29C 33/38* (2013.01); *C25D 5/02* (2013.01); *C25D 17/00* (2013.01); *C25D 17/12* (2013.01)

(58) Field of Classification Search
None
See application file for complete search history.

(56) References Cited

U.S. PATENT DOCUMENTS

2012/0128882 A1* 5/2012 Mirkin .................. G03F 7/0002
427/256

FOREIGN PATENT DOCUMENTS

KR 1020170057967 * 5/2017 ......... B29C 67/0085

OTHER PUBLICATIONS

Boken et al., Plasmonic nanoparticles and their analytical applications: A review, Applied Spectroscopy Reviews, 2017, pp. 1-47.
Brown et al., Material transport in dip-pen nanolithography, Review Article, Frontier Physics, 9(3), 2014, 385-397.
Chen et al., Scientific Reports, Multi-metal 4D printing with a desktop electrochemical 3D printer, Mar. 8, 2019, 9, 3973, pp. 1-9.
(Continued)

*Primary Examiner* — Louis J Rufo
(74) *Attorney, Agent, or Firm* — MARSHALL, GERSTEIN & BORUN LLP

(57) ABSTRACT

Disclosed herein is a massively parallel patterning tool for the deposition of single metals or metal alloys with size and composition control. Methods of the disclosure use a hydrogel array of pyramidal pen tips as a medium for localized electrodeposition, in conjunction with a scanning probe lithography platform and a three-electrode cell. This versatile technique can be used for high-throughput 3D printing, biomolecule patterning, or screening of catalyst nanoparticles or thin films.

19 Claims, 13 Drawing Sheets

(56) References Cited

OTHER PUBLICATIONS

Eliyahu et al., Atomic Force Microscope-Based Meniscus-Confined Three-Dimensional Electrodeposition, Advanced Material Technologies, 2020, 5, 1900827, pp. 1-9.
Hirt et al., Local surface modification via confined electrochemical deposition with FluidFM, Royal Society of Chemistry, 2015, 5, pp. 84517-84522.
Hirt et al., Template-Free 3D Microprinting of Metals Using a Force-Controlled Nanopipette for Layer-by-Layer Electrodeposition, Advanced Materials, 2016, 28, pp. 2311-2311.
Hu et al., Meniscus-Confined Three-Dimensional Electrodeposition for Direct Writing of Wire Bonds, Science, vol. 329, Jul. 16, 2010 pp. 313-316.
Huang et al., Catalyst design by scanning probe block copolymer lithography, PNAS, vol. 115, No. 15, Apr. 10, 2018, pp. 3764-3769.
Huo et al., Polymer Pen Lithography, Science, vol. 321, Sep. 19, 2008, pp. 1658-1660.
Jana et al., Phase- and interlayer spacing-controlled cobalt hydroxides for high performance asymmetric supercapacitor applications, Elsevier B. V. Journal of Power Sources 422. Mar. 2019, pp. 9-17.
Kang et al., A hydrogel pen for electrochemical reaction and its applications for 3D printing, Royal Society of Chemistry, Nanoscale, 2015, vol. 7. pp. 994-1001.
Kluender et al., Catalyst discovery through megalibraries of nanomaterials, PNAS, vol. 116, No. 1, Jan. 2, 2019, pp. 40-45.
Li et al., Electrochemical AFM "Dip-Pen" Nanolithography, J. American Chemical Society, vol. 123, No. 9, Feb. 6, 2001, pp. 2105-2106.
Mahenderkar et al., Epitaxial lift-off of electrodeposited single-crystal gold foils for flexible electronics, Report, Nanomaterials, Science, vol. 355, Mar. 17, 2017, pp. 1203-1206.
Neiva et al., Nickel nanoparticles with hep structure: Preparation, deposition as a thin films and application as electrochemical sensor, Elsevier Inc., Journal of Colloid and Interface Science, vol. 468, Jan. 18, 2016, pp. 34-41.

Piner et al., "Dip-Pen" Nanolithography, Reports, Science, vol. 283, Jan. 29, 1999, pp. 661-663.
Ovshinsky et al., A Nickel Metal Hydride Battery for Electric Vehicles, Science, American Association for the Advancement of Science, New Series, vol. 269, No. 5105, Apr. 9, 1993, pp. 176-181.
Reiser et al., Multi-metal electrohydrodynamic redox 3D printing at the submicron scale, Article Nature Communications, vol. 10, (2019) 1853, pp. 1-8.
Rozhok et al., Dip-Pen Ninolithography: What Controls Ink Transport? J. Phys. Chem. B, vol. 107, No. 3, (2003) pp. 751-757.
Seol at al., Localized Electrochemical Deposition of Copper Monitored Using Real-Time X-ray Microradiography, Advanced Functional Materials, vol. 15. (2005) pp. 934-937.
Seol et al., Electrodeposition-based 3D Printing of Metallic Microarchitectures with Controlled Internal Structures, Materials Views, vol. 11, No. 32, (2015), pp. 3896-3902.
Therese et al., Electrochemical Synthesis of Metal Oxides and Hydroxides, Reviews, American Chemical Society, Mater, vol. 12, No. 5, (2000), pp. 1195-1204.
Vazquez-Mena et al., Metallic Nanodot Arrays by Stencil Lithography for Plasmonic Biosensing Applications, American Chemical Society NANO, vol. 5, No. 2, (2011), pp. 844-853.
Xu et al., A review: Development of the maskless localized electrochemical deposition technology, The International Journal of Advanced Manufacturing Technology, vol. 110, Sep. 2020, pp. 1731-1757.
Yan et al., Anion insertion enhanced electrodeposition of robust metal hydroxide/oxide electrodes for oxygen evolution, Nature Communications, vol. 9, 2373, (2018), pp. 1-9.
Yun et al., Do-it-Yourself Pyramidal Mold for Nanotechnology, American Chemical Society Omega, vol. 4, (2019) pp. 14599-14604.
Zhu et al., Recent Advances in Electrocatalytic Hydrogen Evolution Using Nanoparticles, ACS Publication, Chemical Reviews, vol. 120, (2020), pp. 851-918.

\* cited by examiner

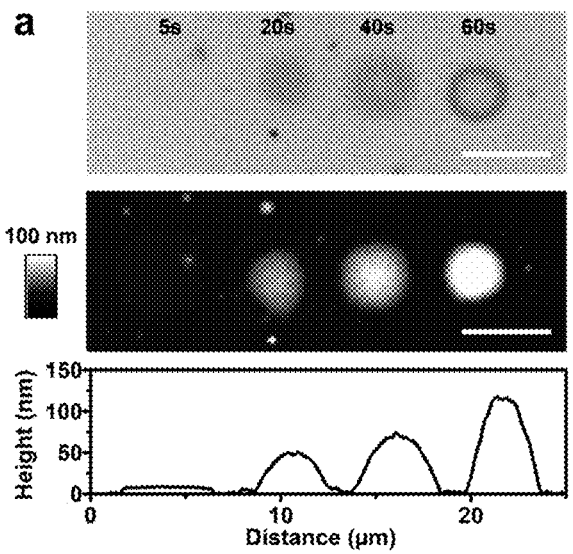
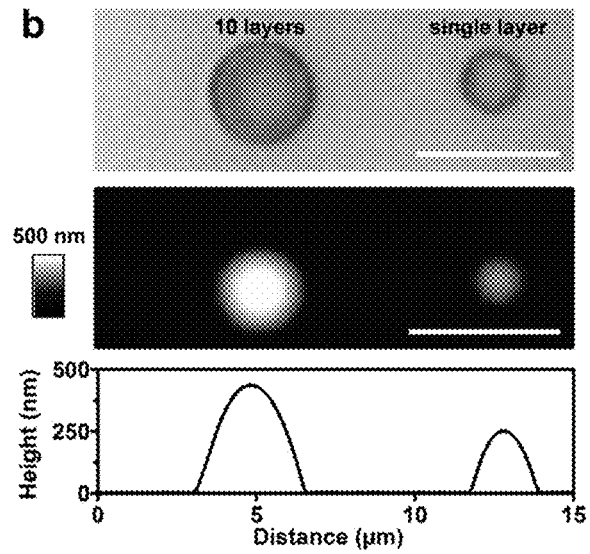
Figure 3A
Figure 3B
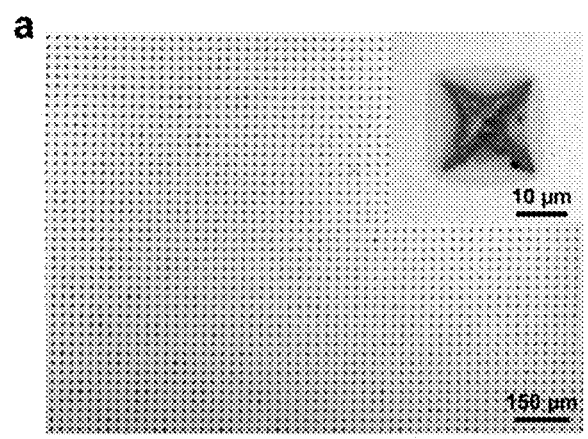
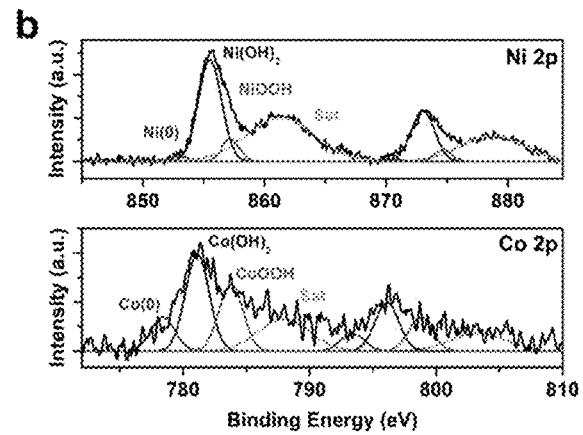
Figure 4A
Figure 4B

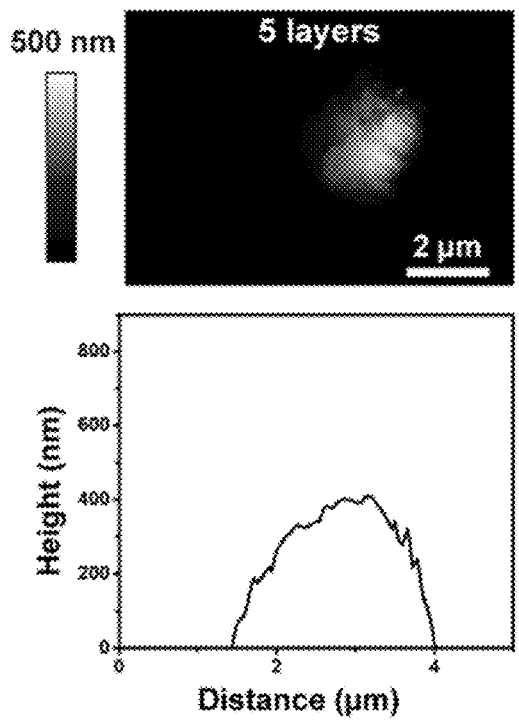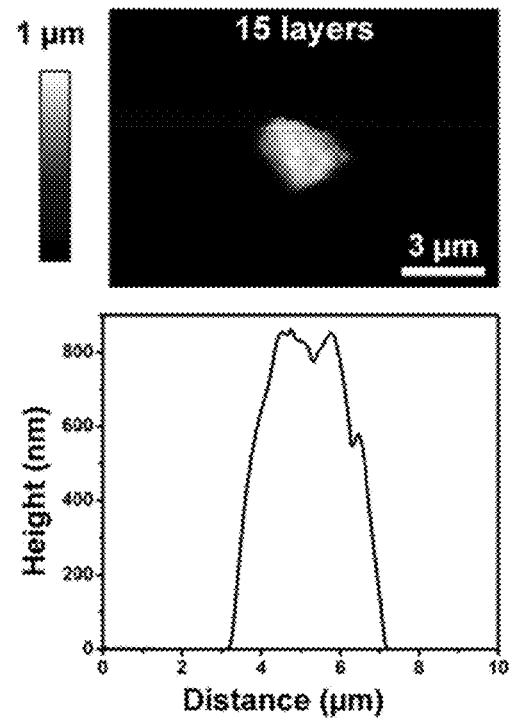
Figure 18A
Figure 18B
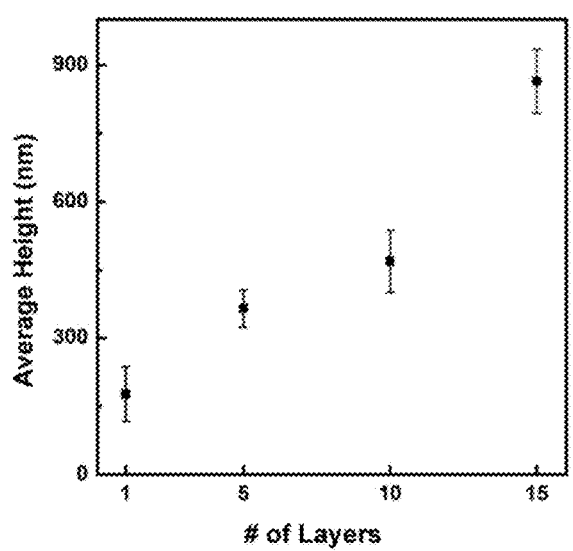
Figure 18C

ELECTROCHEMICAL POLYMER PEN LITHOGRAPHY

CROSS-REFERENCE TO RELATED APPLICATION

This application claims the benefit of priority to U.S. Provisional Patent Application No. 63/142,829 filed Jan. 28, 2021, the disclosure of which is incorporated herein by reference in its entirety.

STATEMENT OF GOVERNMENT SUPPORT

This invention was made with government support under FA9550-16-1-0150 awarded by the Air Force Office of Scientific Research (AFOSR) and DE-SC0000989 awarded by the Department of Energy (DOE). The government has certain rights in the invention.

BACKGROUND

Field of the Disclosure

The disclosure relates to methods for electrodeposition using a hydrogel pen array and hydrogel pen arrays for performing such methods.

Brief Description of Related Technology

Metal micro- and nano-structures have widespread applications in the fields of electrocatalysis, electronics, plasmonics, and magnetics. In order to synthesize, prototype, and discover structures with enhanced activity, methods for printing libraries of materials with control over their size, composition, and location on a single substrate are required. Bottom-up syntheses, compared to the often-used top-down methods, present a potential solution to this challenge, as metal features may be patterned arbitrarily with defined placement and size control. One commonly used bottom-up technique, electrochemical deposition, possesses many benefits wherein both the volume and composition of deposited metal features can be tuned by controlling precursor composition, applied potential, and contact area. While it is a fast, inexpensive, and highly versatile technique, it has typically been limited to conventional thin-film electroplating or more recently, serial single nanostructure deposition.

Scanning probe techniques have shown promise for site-specific nanoscale metal printing via the electrochemical deposition of metals onto a conducting substrate. One such method used a nanopipette or atomic force microscopy (AFM) tip loaded with a metal salt solution to reduce a metal directly onto a cathodic surface for 3D printing of metallic structures. In another technique, a metal ion-embedded hydrogel was molded into a pyramidal shape and used for electrodeposition via the diffusion of metals ions through the hydrogel and reduction on a surface.[5f, g] However, in all cases, the use of a single tip makes patterning large-areas cost-and time-prohibitive, thus limiting their application in the preparation of single-substrate libraries.

SUMMARY

Provided herein is a scalable approach to large-area electrochemical deposition based patterning using a platform such as polymer pen lithography (PPL). PPL is a scanning probe lithography technique that uses a massive array of pyramidal polydimethylsiloxane (PDMS) tips coated in an aqueous "ink" to physically deposit material onto a substrate. The architecture of PPL allows millions of pens to act in parallel, and has been shown to enable the formation of single-substrate libraries with tens of thousands of spatially encoded features, or mega-libraries.

Massively parallel, localized electrochemical deposition using a hydrogen pen array in accordance with embodiments of the disclosure can allow for scanning probe capabilities such as achieved with polymer pen lithography, with the flexibility of electrochemical deposition. The electrochemical polymer pen lithography methods disclosed herein can beneficially eliminate the need for solution-phase surfactants, cleanrooms, or vacuum environments. The methods of the disclosure can beneficially allow for generation of mega-libraries of mono- or multi-metallic nanomaterials and/or the ability to rapidly prototype 2D/3D metallic structures.

BRIEF DESCRIPTION OF THE DRAWINGS

FIGS. 3A and 3B are optical and AFM images showing control over feature dimensions by deposition time and layering using an electrochemical polymer pen lithography system in accordance with embodiments of the disclosure. FIG. 3A includes optical and AFM images of a pattern consisting of 4 Ni features where height was controlled by varying the deposition time. FIG. 3B includes optical and AFM images of a pattern with 2 Ni features where size is controlled by depositing multiple layers of Ni, 60 s at a time. Features shown are 10 vs. 1 layer. Scale bars=5 μm.

FIGS. 4A and 4B show deposition of Ni—Co alloys using methods in accordance with embodiments of the disclosure. FIG. 4A is an optical micrograph of a large-area pattern of >10 um Ni—Co features. The large feature size enables accurate elemental characterization. Inset shows a single feature. FIG. 4B is the XPS characterization of these patterns, which indicates that both the Ni and Co are present mainly as oxides. Auger peaks have been subtracted for clarity.

FIG. 7A is an optical image of an Au-coated Si wafer was patterned with an array of 3 Ni features from each tip. FIG. 7B is an optical image of the wafer of FIG. 7A after being, washed thoroughly with water. FIG. 7C is an optical image of the wafer of FIG. 7B after being sonicated for 30 s in water. While the features faded after agitation, this experiment showed that the patterned features were reduced metal on the substrate and not salt residue. Scale bars=30 μm.

FIG. 8A is an XPS pattern of Ni features on a Au-coated Si wafer. The peaks at 856 eV and 873 eV (left) are expected Ni 2p peaks. Au 4f peaks are observed at 84 eV and 87.7 eV (right). FIG. 8B is an XPS pattern of Pt features on a Au-coated Si wafer. The peak at 73 eV (left) indicates Pt on Au-coated Si substrate with Au 4f peak at 84 eV (right). FIG. 8C is an XPS pattern of Ag features on a Au-coated Si wafer. The presence of the Ag is confirmed by the peaks at 367 eV and 373.6 eV (left) and the peaks at 486 eV and 494.5 eV (right) are assigned to Sn 3d from the indium tin oxide (ITO) coated glass slide. The main peaks in the deposited features are all oxides due to rapid oxidation upon exposure to ambient conditions.

FIG. 10 is a schematic depicting the hypothesized mechanism of the electrochemical deposition method in accordance with embodiments of the disclosure. (1) First, metal reduction occurs preferentially from the meniscus that forms between the tip and the substrate upon contact. (2) Once ions are depleted from the meniscus, reduction occurs directly from the hydrogel, at the tip-substrate interface. (3) When the tip is lifted, the shape and size of the resulting structure corresponds to the shape of the tip-substrate interface, along with a very thin layer from the meniscus.

FIGS. 18A and 18B are AFM height profiles of the features with (A) 5 layers and (B) 15 layers.

FIG. 18C is a graph showing the average feature height versus the number of printed layers.

DETAILED DESCRIPTION

In embodiments, an electrochemical polymer pen lithography pen array system can include a rigid support holding a pen array and having a reference electrode reservoir for containing a patterning composition such that it is in fluid communication with the pen array and allows the reference electrode to be at least partially immersed in the patterning composition. The systems of the disclosure advantageously allow the pen array to remain continuously in fluid communication with the patterning composition, which serves also as the electrolyte for the reference electrode. Systems of the disclosure also advantageously maintain the pen array and the reference electrode in a unit, which can allow them to together be maintained above the substrate during patterning.

In embodiments, the rigid support includes a pen array receiving area for receiving the pen array. The pen array receiving area is in fluid communication with the reference electrode receptacle. The pen array is disposed in the pen array receiving area such that pens of the pen array extend outwardly from the rigid support so as to be able to contact a substrate during patterning.

In embodiments, an electrochemical polymer pen lithography pen array can include a plurality of pens connected by a common backing layer, which in turn is connected to a transparent, conductive and rigid support that is or includes a transparent electrode. The common backing layer has oppositely disposed first and second surfaces. The transparent, conductive rigid support is attached to the first surface and the pens extend outwardly and are fixed to the second surface. The plurality of pens are formed of a hydrogel and each pen includes a base attached to the common substrate and an oppositely disposed tip for contacting a substrate during patterning. The pen array further includes a rigid substrate to which the common substrate is attached. The pens can be pyramidal shaped.

Figure 16:
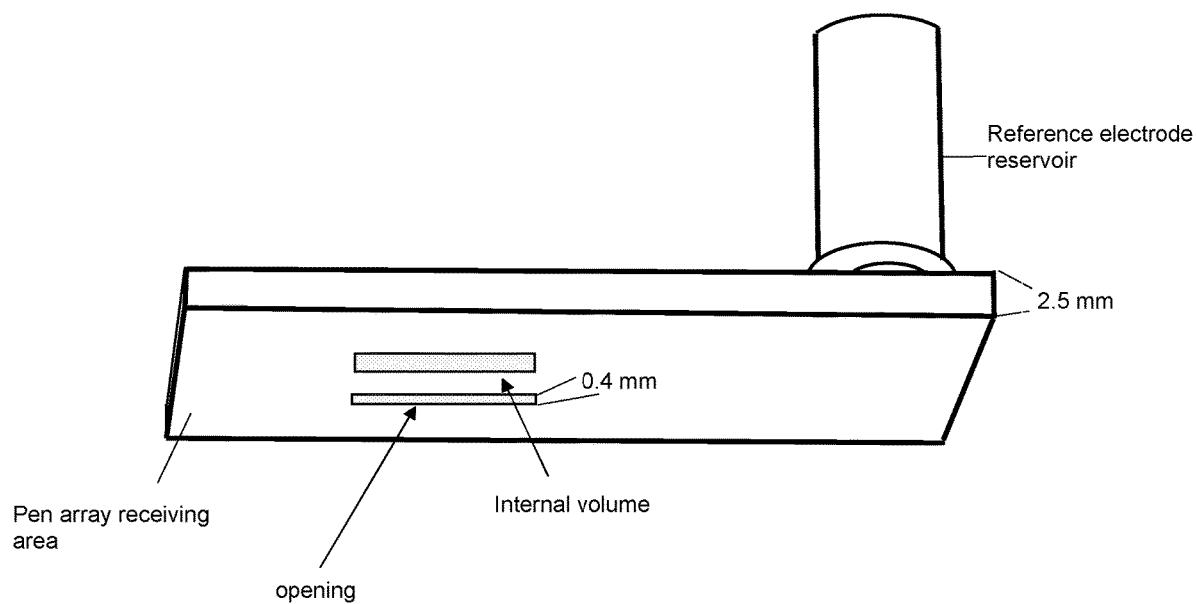
FIG. 16 is a schematic image of a rigid support in accordance with embodiments of the disclosure, showing the internal volume through the openings in the pen receiving area.

Referring to FIG. 16, the pen array is disposed in the pen array receiving area of the rigid support. In embodiments, the pen receiving area of the rigid support includes a plurality of walls that define an internal volume. Oppositely disposed first and second openings or windows are disposed in oppositely disposed ones of the plurality of walls. In embodiments, the pen array is disposed in the pen array receiving area such that the common backing layer is situated in the internal volume and the pens extend outwardly through the second opening and a portion of the first surface of the common backing layer is exposed through the oppositely disposed opening, for example the first opening. The transparent, conductive rigid support can be attached to the common backing layer portion exposed through the opening.

In embodiments, the pen array can be formed in the rigid support such that the internal volume is filled with a hydrogel forming the common backing layer during formation of the pen array, fixing the pen array in the pen array receiving area. For example, in embodiments, the pen array can be formed in the rigid support by disposing the rigid support above a pen array master and filling the master including the internal volume with a hydrogel to thereby form the pens using the pen array and form the common backing layer through filling of the internal volume. In embodiments in which the pen array is formed within the rigid support, the thickness of the internal volume can be defined to a suitable thickness such that it is within the focal distance of the optical microscope to be used with the system for optical leveling through the pen array.

In embodiments, the internal volume extends to beneath the reference electrode reservoir, such that when filled with the hydrogel of the common backing layer, the common backing layer defines a bottom surface of the reference electrode, such that the patterning composition when filled into the reservoir is in contact with the common backing layer and the reference electrode when inserted into the reservoir rests on the common backing layer.

The pen arrays are non-cantilevered and comprise pens, which can be designed to have any shape or spacing between them, as needed. The shape of each tip can be the same or different from other pens of the array. Contemplated tip shapes include spheroid, hemispheroid, toroid, polyhedron, cone, cylinder, and pyramid (trigonal or square). The pens terminate in a sharp tip, so that they are suitable for forming submicron patterns, e.g., less than about 500 nm. The sharpness of the tip is measured by its radius of curvature, and the radius of curvature of the tips disclosed herein is below 1 µm, and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm.

The pen array can be formed from a mold made using photolithography methods, which is then used to fashion the pen array using a polymer as disclosed herein. The mold can be engineered to contain as many tips arrayed in any fashion desired. The pens of the pen array can be any number desired, and contemplated numbers of pens include about 1000 pens to about 15 million tips, or greater. The number of pens of the pen array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The pens of the pen array can be designed to have any desired thickness, but typically the thickness of the pen array is about 50 nm to about 1 µm, about 50 nm to about 500 nm, about 50 nm to about 400 nm, about 50 nm to about 300 nm, about 50 nm to about 200 nm, or about 50 nm to about 100 nm. Thickness of the pens as used herein refers to the distance between the base and the oppositely disposed tip.

The pens can be arranged randomly or in a regular periodic pattern (e.g., in columns and rows, in a circular pattern, or the like). The pens can all have the same shape or be constructed to have different shapes.

The pens and the backing layer can be formed of a hydrogel. Various hydrogels are contemplated for use in the pens and the backing layer. The pens and the backing layer can be formed of the same hydrogel or of from different hydrogels. Examples of hydrogels include, but are not limited to polyacrylamide hydrogel and agarose hydrogel.

The backing layer is attached to the rigid conductive support directly and/or through the use of a monolayer to improve adhesion. For example, in embodiments in which the pen array, including the backing layer, is formed from a polyacrylamide hydrogel, the backing layer can be attached to the conductive support through an acrylate monolayer. Silanes with amino groups could be used as an adhesive layer for adherence of the backing layer to the rigid support.

The rigid conductive support is transparent. The support is planar or substantially planar. The planar or substantially planar rigid conductive support allows a user to uniformly engage the pens. In embodiments, the support can be an ITO-coated glass slide. In embodiments, the ITO-coated glass slide can further be acrylated for adhesion of the backing layer of pen array to the support.

The rigid support can allow both the pen array and the reference electrode to be maintained above the substrate to be patterned. This can allow for leveling/aligning of the pen array optically using the transparent rigid conductive substrate of the pen array. It has been found that the system in accordance with the disclosure beneficially keeps the pen array with the patterning composition and reference electrode in a single system, which prevents the pen arrays from drying out too quickly and allows for maintaining proper current control.

The pens can be loaded with a patterning composition for electrochemical deposition. The patterning composition can be a metal salt solution. The metal salt solution can include one or more metals. For example, the metal salt solution can include one or more of Ni, Ag, Au, Pt, Co, and Mo. Multimetallic features can be patterned using a metal salt solution containing multiple metals. For example, metal alloys can be generated from patterning solutions containing a multi-metal salt solution. For example, a Ni—Co alloy or a Ni—Mo alloy can be patterned using a patterning composition containing a nickel-cobalt salt solution or a nickel-molybdenum salt solution, respectively.

The pens can be loaded with the patterning composition by soaking the pens in the patterning composition. For example, the pens can be soaked in the patterning composition for about 3 to about 48 hours. Any suitable amount of time can be used to allow for the metal salts of the patterning composition to diffuse into the hydrogel.

In embodiments, a method of electrochemical deposition can include bringing the pen array in contact with a substrate and applying a voltage for a determined hold time, which reduces metal ions at each pen location to thereby deposit the metal.

Figure 5:
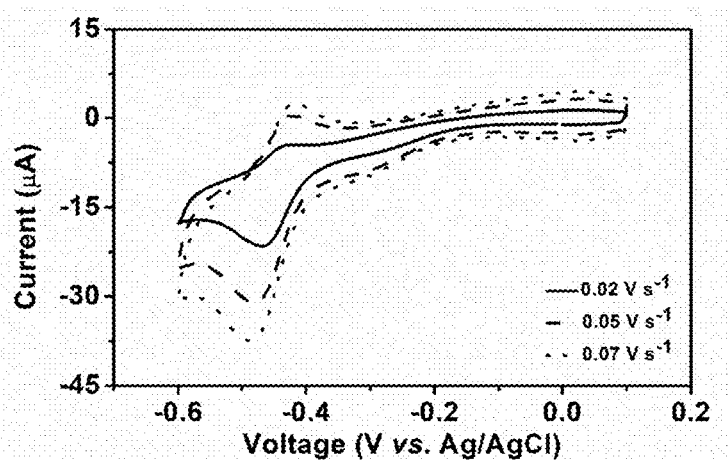
FIG. 5 is a graph of CV scans for an Ni-embedded hydrogel 3-electrode cell in accordance with the disclosure at three different scan rates, indicating both reduction and oxidation potential peaks.

The applied voltage necessary for deposition can be readily determined based on the reduction potential of the metal to be deposited. The reduction potential represents the minimum voltage necessary to pattern. However, higher voltages can generally be used to increase the kinetics of the system. In order to determine the potential required to affect electrodeposition, cyclic voltammetry (CV) experiments were performed. Both reduction and oxidation peaks are observed at three different scan rates (FIG. 5), indicating that the system of the disclosure behaves similarly to a general diffusion-limited system. The experimentally determined $E_{1/2}$ was $-0.453\pm0.004$ V (vs. Ag/AgCl), consistent with the reduction potential of $Ni^{2+}$ to Ni(s), which is $-0.459$ V (vs. Ag/AgCl) for a 1.32 M solution. While $-0.453$ V is sufficient to deposit Ni, the rate of deposition at this potential was low.

Therefore, a higher potential (−0.95 V) was used, while taking care to avoid potentials (<−1.0 V) at which point the onset of gaseous hydrogen evolution occurs and bubbles disrupt the deposition process.

The size of the patterned feature can be controlled though control of the deposition time—the time for which a voltage is applied while the pen array remains in contact with the substrate. Increased applied voltage time from the substrate to be patterned on and the backing layer of the pens increases the resulting patterned feature size. In addition, increased pressure from the pens to the substrate to be patterned on increases the contact area, which also results in increased resulting patterned feature size. Further, tilting of the pen array can be used to pattern gradients of feature sizes.

Layer-by-layer deposition could also be achieved using the pen array system of the disclosure. Layer-by-layer deposition results in increases in feature height, and can, in some instances, increase width. Layer-by-layer deposition can be used alone or in conjunction with deposition time controls and/or contact area controls to generate 3D metallic structures of various sizes in a high-throughput manner.

The substrate to be patterned can be any substantially flat, conductive substrate. For example, the substrate can be an Au-coated Si-wafer.

Methods of the disclosure can be used in high-throughput 3D printing, biomolecule patterning, or screening of catalyst nanoparticles or thin films.

EXAMPLES

Metal Deposition Solutions

Ni, Pt, and Ag electroplating solutions were purchased from Technic, Inc. Ni—Co electrolyte solution was prepared by combining 22 g $Ni(NO_3)_2 \cdot 6H_2O$ and 2.2 g $Co(NO_3)_2 \cdot 6H_2O$ in 40 mL DI water for a 10:1 molar solution, and 22 g of both $Ni(NO_3)_2 \cdot 6H_2O$ and $Co(NO_3)_2 \cdot 6H_2O$ for a 1:1 molar solution.

Preparation of Polyacrylamide Hydrogel Solution

A gel stock solution was prepared by dissolving 2.38 g acrylamide and 0.25 g bis-acrylamide powders in 100 mL DI water, which is enough to fabricate 1-2 pen arrays. The curing process was initiated by adding 880 µL of 10 wt % ammonium persulfate (APS) and 88 µL of tetramethylethylenediamine (TEMED) to the stock solution. All chemicals were purchased from Sigma-Aldrich, Inc.

Fabrication of Pen Array Masters

Masters were fabricated following procedures outlined in prior reports.[1] In brief, a photoresist, Shipley S1805, was spin-coated on a silicon <100> wafer with a 5000 Å thermal oxide layer (NOVA Electronic Materials, LLC.). The wafer was soft baked at 115° C. for 80 s and cooled to room temperature. Using a mask aligner (Suss MJB4; Suss Micro-Tec), the wafer was UV-exposed to pattern 15×15 µm² squares with a 30 µm pitch; 30 µm was used for all the data shown here, but arbitrary pitch distances up to 120 µm have been successfully used as well. The patterns were developed in MF-319 developer for 60 s and rinsed with water. To remove the oxide layer before the etching step, the patterned Si wafer was immersed in a buffered HF solution. The patterns were then selectively etched in potassium hydroxide, which results in an array of inverted pyramids. Pyramids form due to an anisotropic etch which etches the <100> face of silicon ~74 times faster than the <111> face. The surface of the Si wafer was coated with fluorinated silane to facilitate the lift-off process of the hydrogels by making it superhydrophobic. Masters were cleaned periodically by sonicating for ~10 min in methanol, then rinsed with DI water and dried.

Assembly of an Electrochemical Cell

Figure 1A:
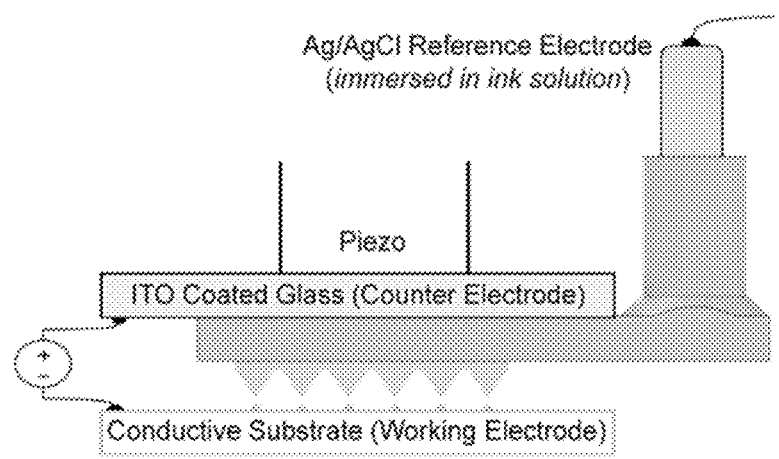
FIG. 1A shows an experimental setup of a three-electrode cell electrochemical polymer pen lithography system designed to hold the hydrogel array, electrolyte, and reference and counter electrodes in place during patterning in accordance with embodiments of the disclosure.
Figure 1B:
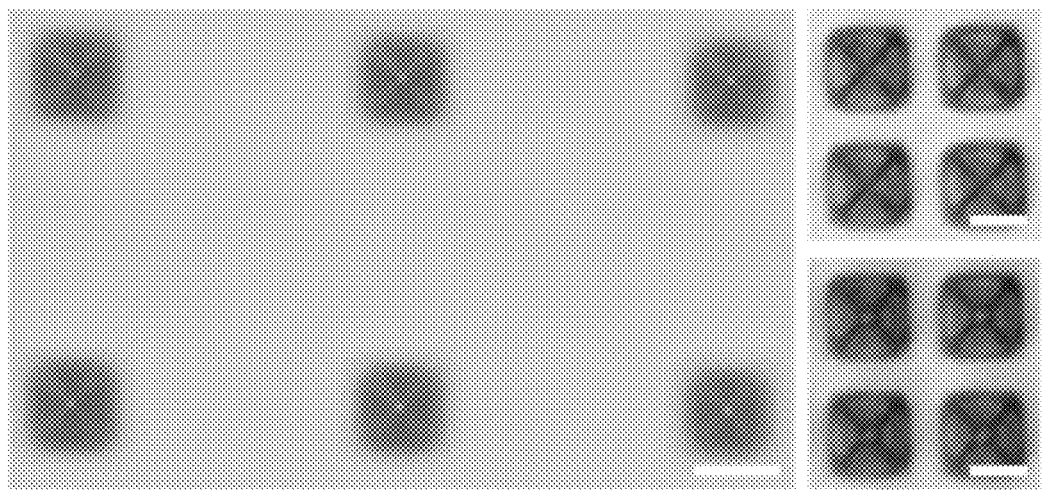
FIG. 1B is an optical image of fabricated polyacrylamide hydrogel pen arrays, which were prepared by curing the hydrogel within a silicon master (scale bar=30 μm). Images on the right show a pen array during the patterning process, highlighting how contact was determined: pens (top) out-of-contact and (bottom) in-contact with the substrate (working electrode) (scale bars=15 μm).
Figure 1C:
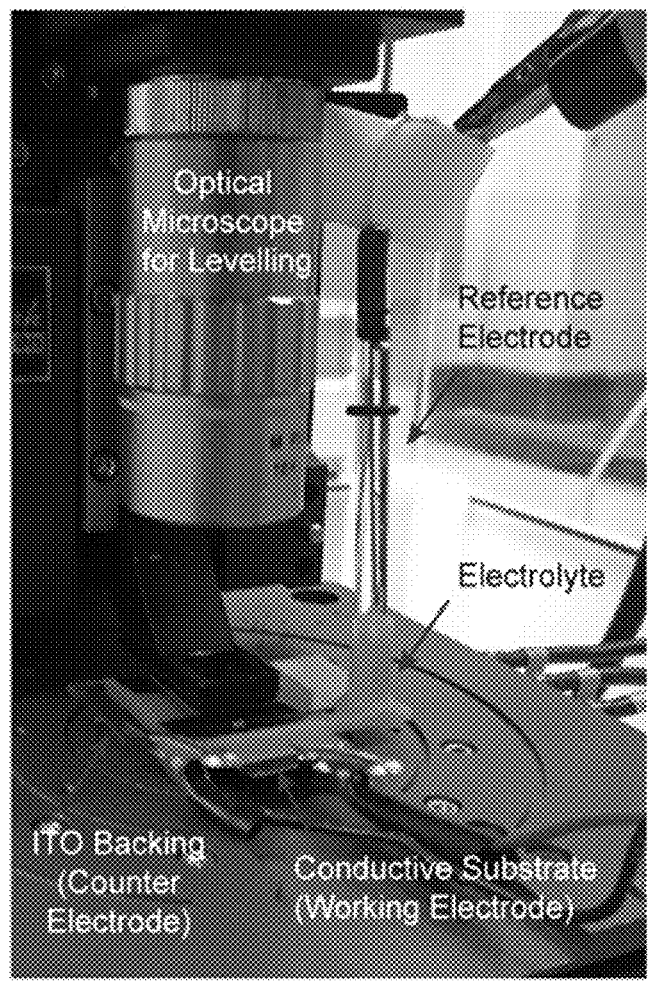

In Examples 1 and 2, a pen array system in accordance with the disclosure was used for leveling and patterning. The setup of the three-electrode cell is shown in FIG. 1B. The rigid support included a pen array receiving area that had an internal volume defined by a plurality of walls each having a thickness of 0.4 mm. The pen array receiving area had a thickness of 2.5 mm. The rigid support included a reference electrode reservoir in fluid communication with the internal volume. In order to attach the acrylamide hydrogel to an indium tin oxide (ITO)-coated glass slide (Nanocs Inc.), the surface was functionalized with 3-(trimethoxysilyl)propyl acrylate (Sigma-Aldrich) in toluene (1:3 by volume) via vaporization in a sealed chamber. The functionalized ITO glass slide was attached to the top of the rigid support using double-sided tape. The rigid support was then placed directly onto a Si master, and the gel solution was poured into and around the internal volume of the pen array receiving area through the reference electrode reservoir at the corner of the rigid support. The gel was cured for no longer than 30 min at room temperature. The molded gel was removed from the master and soaked in a Ni, Pt, Ag, or Ni—Co patterning composition for at least 3 h or overnight in order for the metal salts to diffuse into the hydrogel. The entire pen array system was mounted to an AFM head for patterning, and the ITO substrate was clipped to a long wire, which served as the counter electrode. To create a functional working electrode (or a substrate), a long wire was connected via a flat alligator clip to a gold-coated Si wafer. A Ag/AgCl electrode in 3 M NaCl (BASi, Inc.) was used as a reference electrode and inserted gently into the reservoir at the corner of the rigid support, along with additional patterning composition. The reservoir was filled with 0.5 ml.

Patterning Procedure

Before patterning, the pen arrays were aligned to the substrate using the optical alignment method described herein. Controlled potential electrolysis (CPE) was performed to generate each feature. Once the tips were in contact with the substrate, a constant voltage was applied using a potentiostat (BASi EC Epsilon) for a given amount of time, depending on the metal used and thickness desired (Table 1 Below). The speed of the piezo in the x-y and z directions was set to 0.1 µm/s, allowing each pen tip to be replenished with metal ions before patterning the next feature.

TABLE 1

Applied voltages and minimum deposition times used for each metal deposition

| Metal | Applied Voltage (mV) | Minimum Deposition Time (s) |
|---|---|---|
| Ni | −950 | 20 |
| Ag | −950 | 10 |
| Pt | −550 | 10 |
| Ni—Co | −500 | 60 |

Characterization of Patterns

The patterned images were observed using optical microscopy (Zeiss Axio Imager.M2m) and scanning electron microscopy (SEM; Hitachi SU8030). The height and surface roughness of the patterned features were analyzed using atomic force microscopy (AFM; Dimension Icon; Bruker).

Using NCHR-50 cantilevers (Nanoworld), images were acquired in tapping mode at a scan rate between 0.10-0.99 Hz with a spring constant of 42 N/m. The imaging was performed at room temperature, and the collected data was analyzed using NanoScope Analysis software. Elemental analysis was performed via energy dispersive spectroscopy, fitted onto SEM (Hitachi SU8030) and X-ray photoelectron spectroscopy (XPS, Thermo Scientific EscaLab 250 Xi) to characterize the composition of the patterned features.

Example 1: Patterning Single Metal Features

Figure 2A:
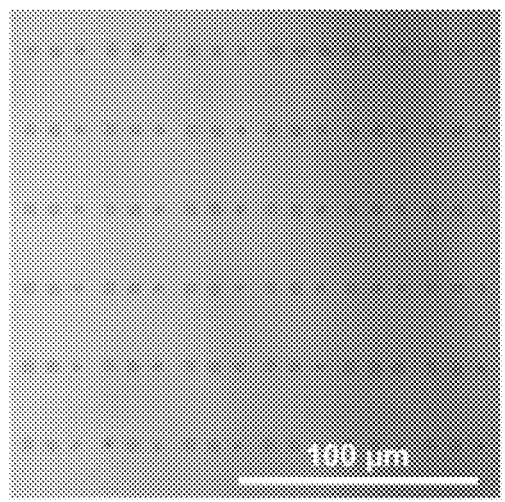
FIGS. 2A-2C are optical micrographs showing the patterning capabilities of an electrochemical polymer pen lithography system in accordance with embodiments of the disclosure with patterns of (A) Ni on a Au substrate (scale bar=100 μm), (B) Ag on an ITO substrate (scale bar=20 μm), and (C) Pt on a Au substrate (scale bar=100 μm) being shown respectively. The Pt pattern consists of an array of 13 dots arranged as the letter 'N' at each pen location.
Figure 2B:
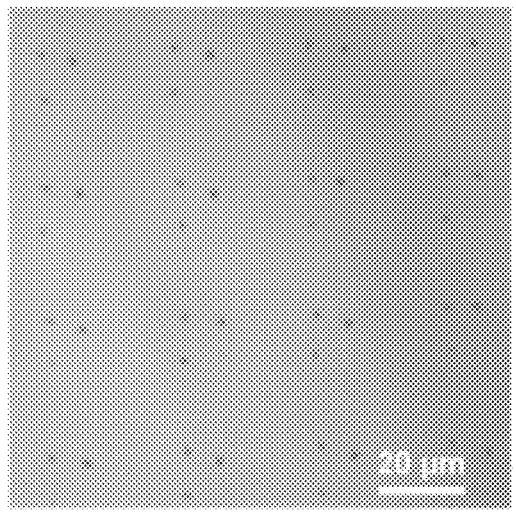
Figure 2C:
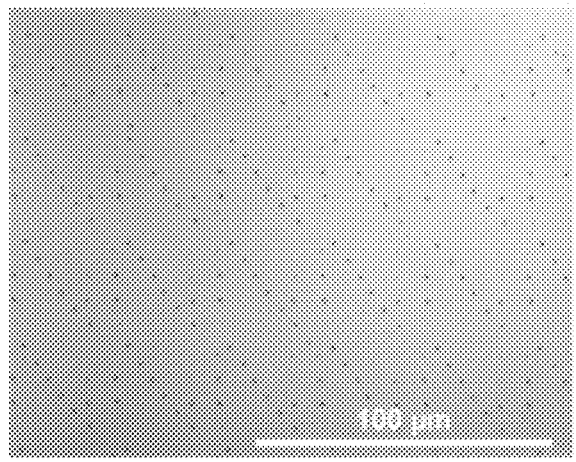
Figure 2D:
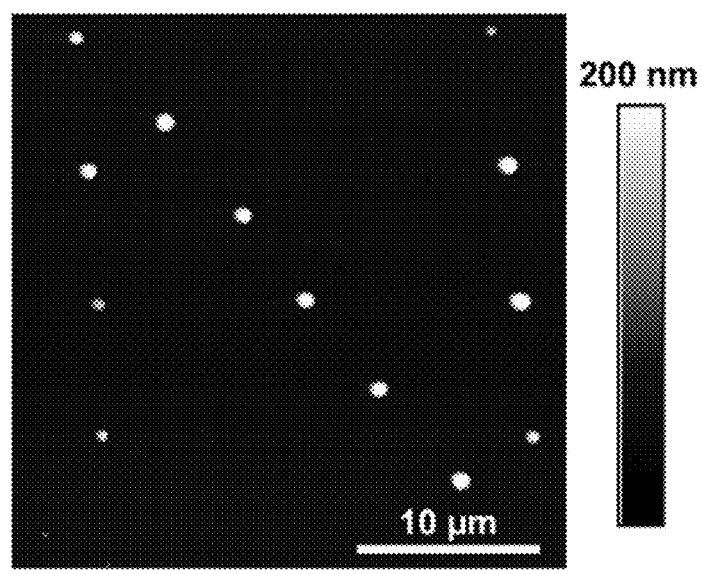
FIGS. 2D and 2E are AFM images of (D) a single 'N' (scale bar=10 μm) and (E) a single Pt particle (scale bar=500 nm).

A hydrogel pen array in accordance with the disclosure was loaded with a nickel electroplating solution (~1.32 M) and an Au-coated Si-wafer as the substrate (or working electrode). The hydrogel with the counter and reference electrodes was loaded onto an AFM, and the contact point of each tip across the array with the substrate was determined optically as the center of the pyramidal tip changes from black to white upon contact (FIG. 1B). To deposit a pattern of three Ni features in a line, a reduction potential of −950 mV was applied for 30 s at the point of contact for each pen in a single array (FIG. 2A). The resulting features had an average width of 4.5±0.1 μm (SE), indicating the relative uniformity of the patterning across the substrate.

Figure 6A:
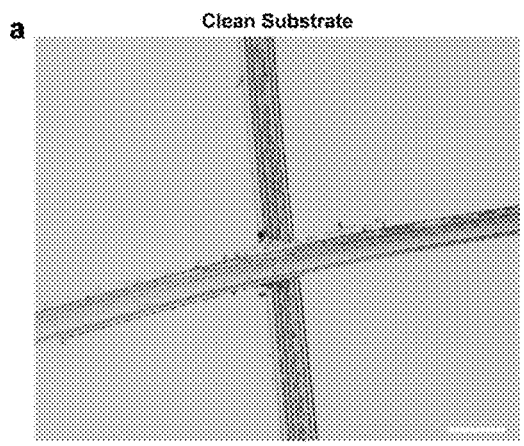
FIGS. 6A and 6B are optical images illustrating that an applied voltage is needed for metal deposition using methods in accordance with embodiments of the disclosure. A Au-coated Si wafer was scratched with a cross and imaged before (A) and after (B) typical Ni patterning with 0 V applied. No patterned features are observed. Scale bars=50 mm.
Figure 6B:
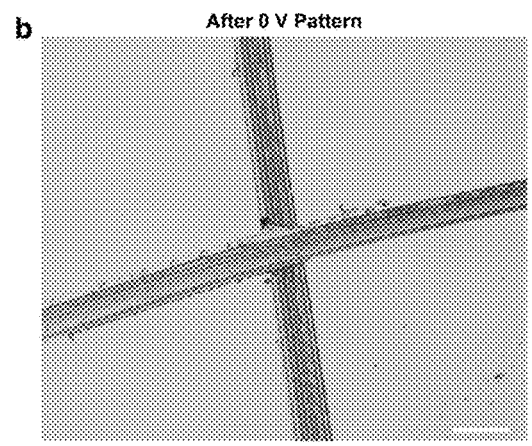
Figure 7A:
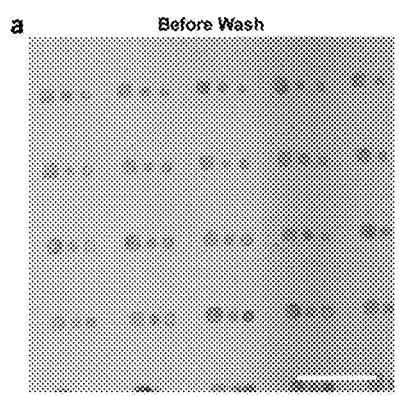
FIGS. 7A-7C are optical images showing a substrate with Ni features before and after extensive rinsing indicating the presence of reduced metal.
Figure 7B:
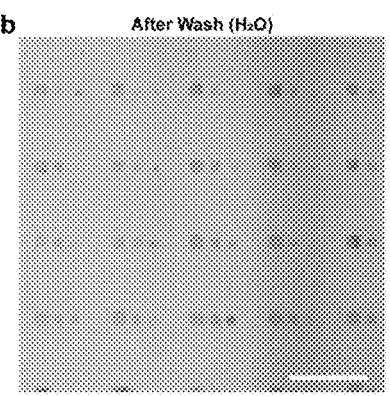
Figure 7C:
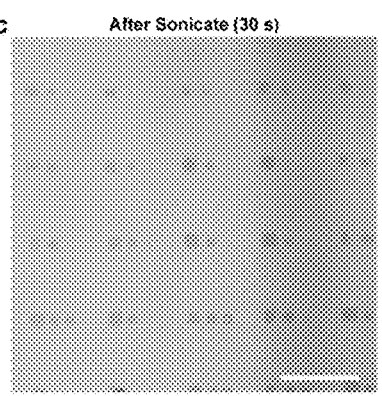
Figure 8A:
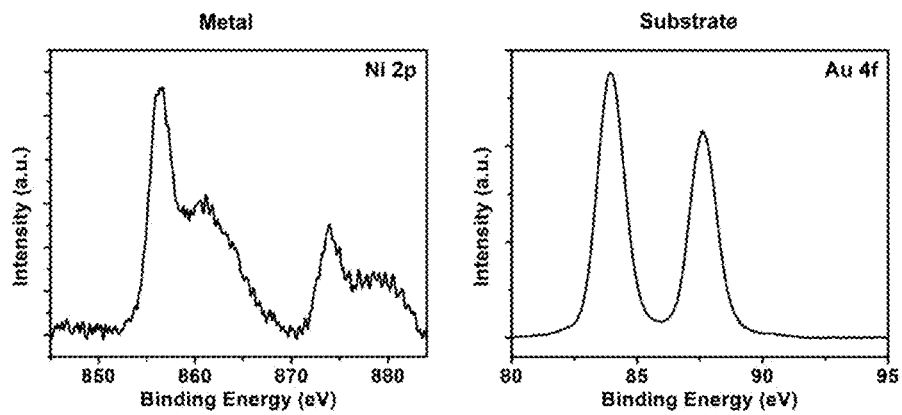
FIGS. 8A-8C are XPS patterns of the patterned samples confirm the presence of metal on the respective substrates.
Figure 8B:
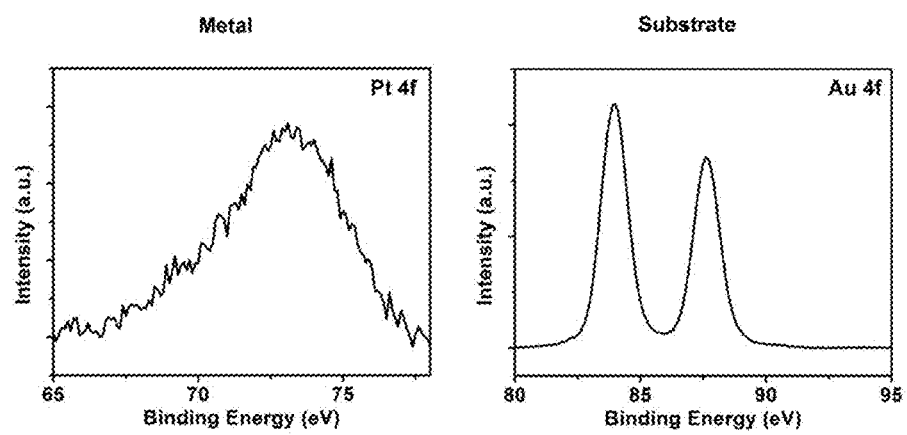
Figure 8C:
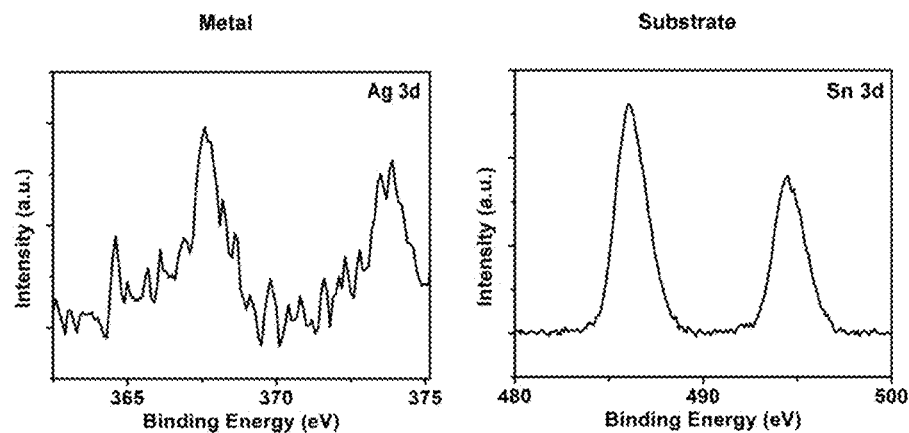
Figure 9A:
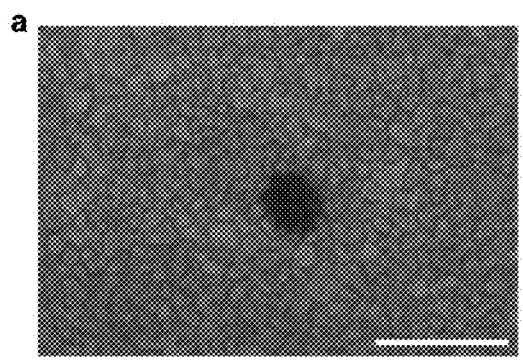
FIGS. 9A-9D are scanning electron micrographs of patterned Pt features on Au-coated Si wafer, highlighting the high-resolution capability of ePPL. The black features indicate Pt particles with diameters ranging from ~210 nm to 280 nm. Scale bars=500 nm.
Figure 9B:
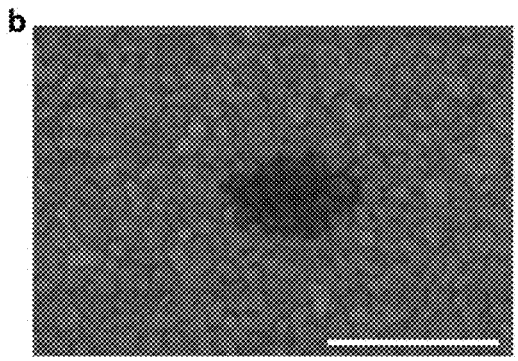
Figure 9C:
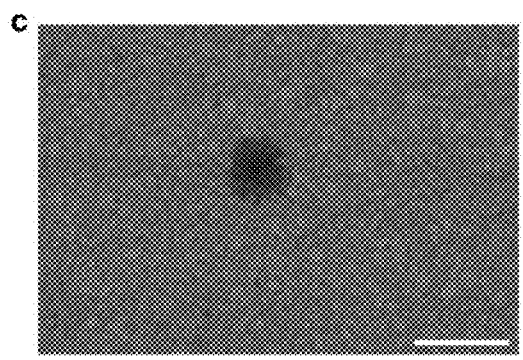
Figure 9D:
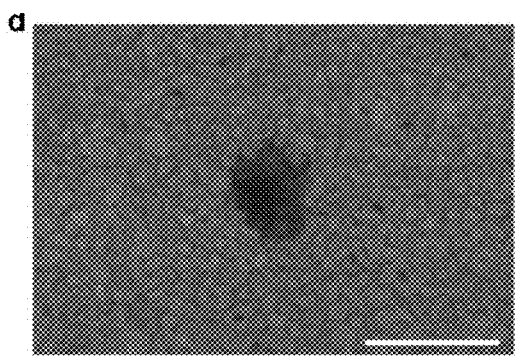

To confirm that the observed metal features were electrochemically deposited rather than physically transferred from the hydrogel, two sets of control experiments were carried out. In the first, no features were observed when Ni patterning was performed without an applied voltage (FIG. 6). In the second test, a patterned sample was thoroughly rinsed with water and then sonicated to remove any residual salt from the substrate (FIG. 7). Even after this aggressive washing, the patterns remained, indicating that the observed features are not remnant salt or liquid residues from the hydrogel, but rather metallic features adhered to the substrate.

Figure 2E:
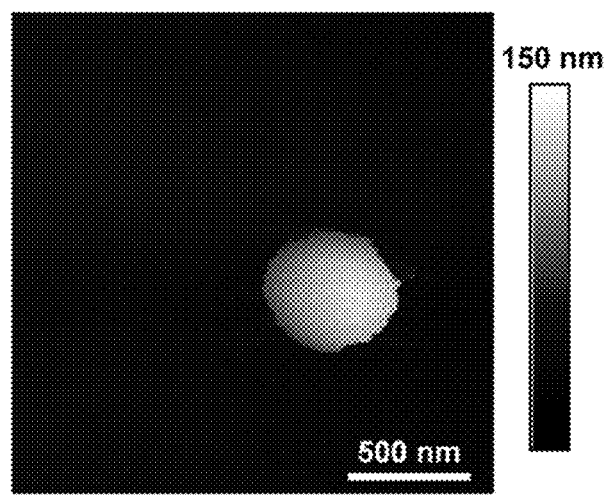
Figure 2F:
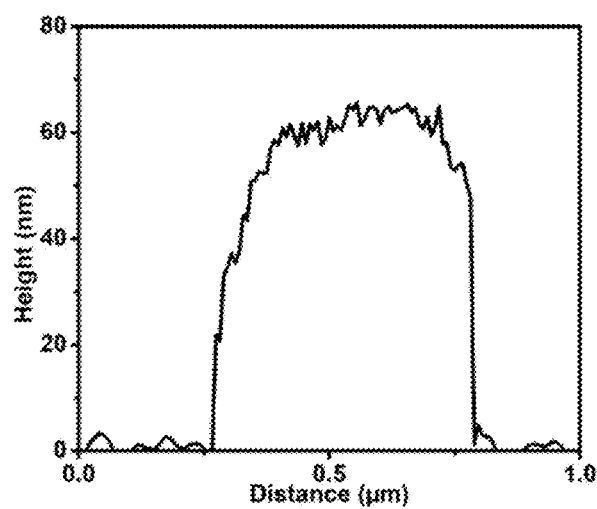
FIG. 2F is a graph showing the associated line scan of the particle in FIG. 2E.

To test the versatility of this lithographic tool, arbitrary patterns were generated using various metal inks such as Pt and Ag in addition to Ni, as well as a different substrate (ITO). The resulting patterns were characterized via AFM and x-ray photoelectron spectroscopy (XPS) (FIGS. 2B-2D, 8). For instance, the letter "N" was printed on an Au-coated Si-wafer using Pt where a reduction potential of −500 mV was applied for 10 s. This resulted in a pattern comprised of 13 features per pen with an average diameter and height of 777±81 nm and 166±7 nm, respectively, as determined via AFM (FIGS. 2E and F).

Figure 10:
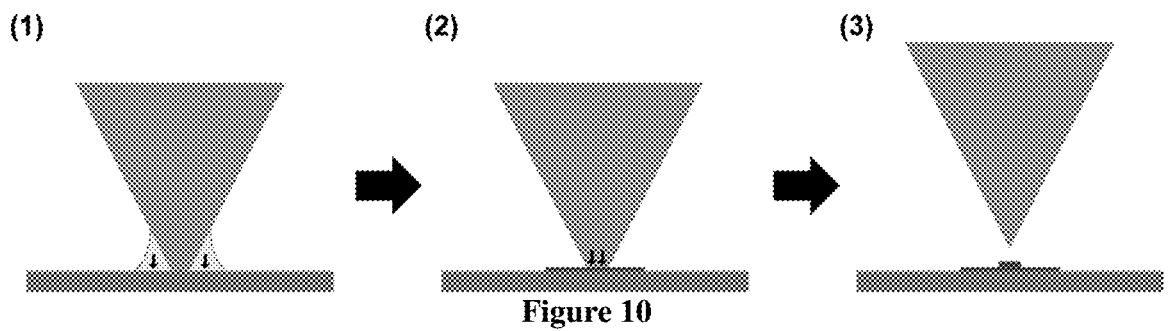
FIG. 10 is a photograph of the experimental setup in a Park AFM, showing the cell, electrodes, electrical leads, and optical microscope used for leveling.
Figure 17:
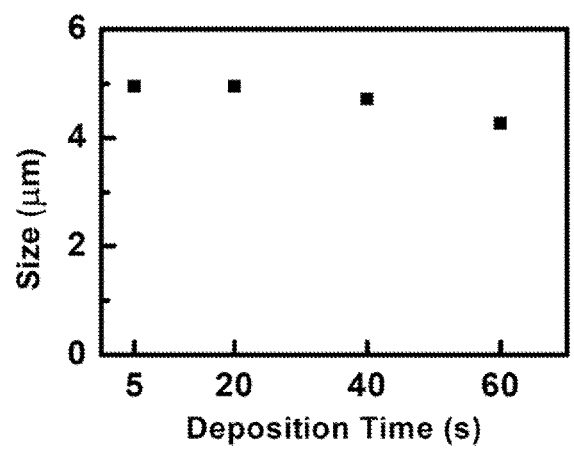
FIG. 17 is a graph showing feature size (diameter) measured as a function of deposition time from the features in FIG. 3A.

Additionally, with this technique, the dimensions of printed features can be controlled, demonstrating the ability of methods of the disclosure for high-throughput printing of 3-dimensional metallic structures. The width of each feature depends largely on pen-substrate contact area, where the smallest diameter achieved was ~210 nm (FIG. 9), which corresponds approximately with the sharpness of each tip. Two methods were used to control feature height: (i) varying the deposition time and (ii) layer-by-layer deposition. In the first case, it was found that, as expected, the height of a Ni feature increased with deposition time (FIG. 3A). It is important to note that a thin base layer was observed for all deposition times; this is particularly obvious at 5 and 20 s. Without intending to be bound by theory, it is believed that as with Dip-pen Nanolithography, an electrolyte meniscus initially forms as the pens come into contact with the substrate, and ions in this meniscus are reduced first, resulting in a thin layer (FIG. 10). As the ions in the meniscus are depleted, however, reduction occurs directly from the hydrogel. Because the hydrogel contact area was smaller than that of the meniscus, the following layers was smaller in width as well, as evident at later time points (FIG. 17). Horizontal features size decreased slightly with increased deposition time because material deposits from a meniscus at first, followed by the deposition directly from the hydrogel pen, which is smaller than the meniscus. The height, nonetheless, is directly related to deposition time, as shown in FIG. 3A.

Feature height can also be controlled by depositing metals in a layer-by-layer fashion. After deposition of each layer, the pen arrays were lifted 100 nm in the z-direction. The overall feature height increased with the number of layers. A nearly two-fold increase in height was observed for a feature with 10 layers versus that of a single layer (FIGS. 3B and 18). Here, growth occurred in both the height and width of the features as deposition occurred outwards over time, likely due to the hydrogel pen acting as a physical barrier to increasing feature height. This may be overcome by more precise tuning of each layer height with corresponding z-movement. Therefore, using this layer-by-layer method in combination with control over the deposition time, this technique can be used to generate 3D metallic structures of various sizes in a high-throughput manner.

Example 2: Multimetallic Patterning

Figure 11:
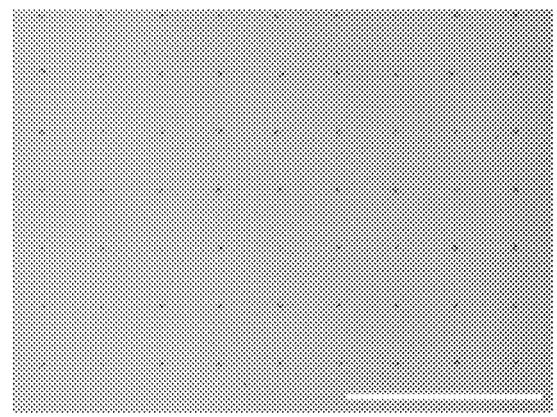
FIG. 11 is an optical micrograph of Ni—Co particles patterned on a Au substrate. Scale bar=50 μm.
Figure 12A:
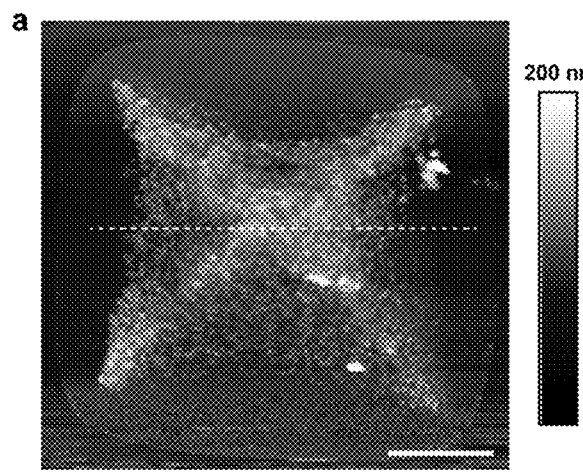
FIG. 12A is an AFM height profile of a large Ni—Co feature.
Figure 12B:
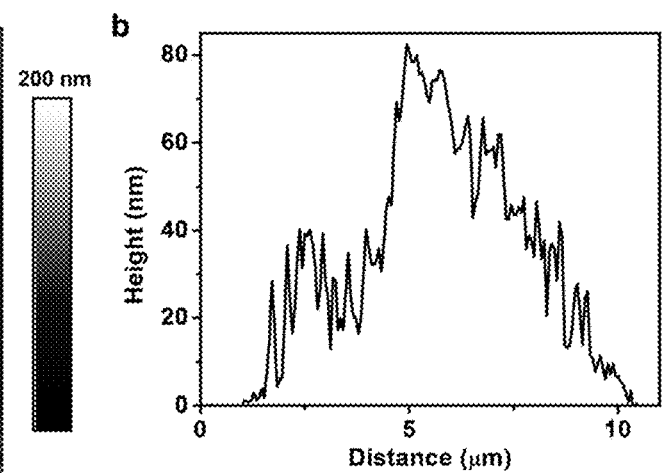
FIG. 12B is an AFM line scan across the large feature in FIG. 12A, location indicated by dashed line. Scale bar=3 μm.
Figure 13A:
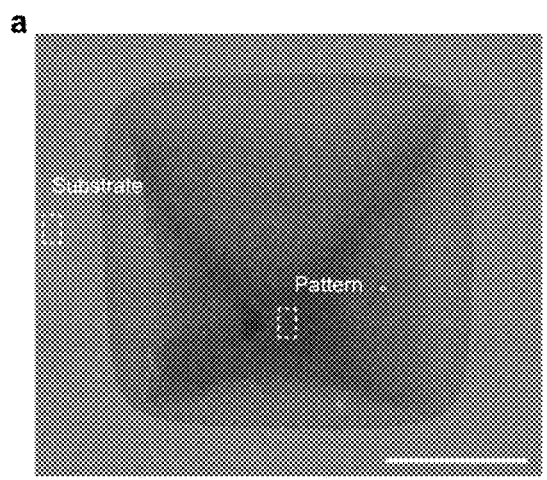
FIG. 13A is a SEM image of a Ni—Co feature. Ni—Co was patterned on an Au-coated SiO$_2$ wafer with a chromium adhesion layer. Scale bar=5 μm.
Figure 13B:
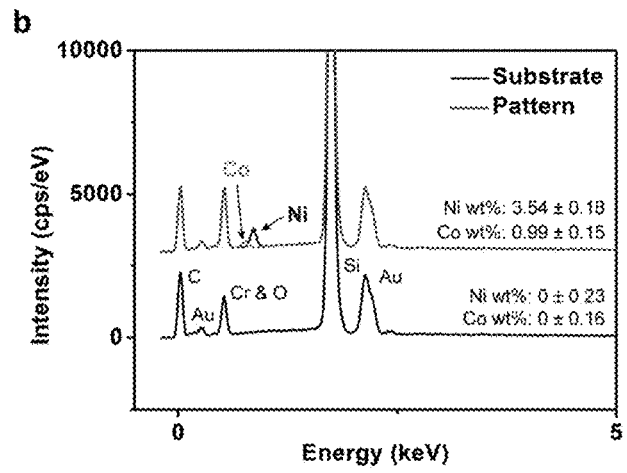
FIG. 13B is EDS characterization of the Ni—Co feature of FIG. 13A, showing the presence of both Ni and Co in the deposited region. Corresponding metal peaks are labeled.

Because this technique is diffusion-based, multiple metals can be absorbed by the hydrogel at once, such that multimetallic features can be patterned as long as they have comparable reduction potentials. To test this, a hydrogel pen array was saturated with a 10:1 nickel-cobalt salt solution and used to pattern Ni—Co alloys, one of the known hydrogel evolution reaction (HER) catalysts, onto an Au coated silicon wafer at −550 mV. In order to understand the composition of the deposited features, a surface characterization tool like XPS is needed. Because this is a surface-sensitive technique, larger features were patterned in order to generate sufficient signal (FIG. 4A), although smaller features are possible (FIG. 11). These large features were patterned with fully extended pen tips resulting in a pyramidal structure that corresponds to the shape of the pen tip (FIG. 4A inset). AFM analysis shows that these patterned features are ~80 nm tall, with a base layer of ~12.5×12 μm$^2$ and 10 nm in height (FIG. 12).

To confirm the presence of reduced Ni and Co, XPS analysis was performed. The Ni 2p and Co 2p spectra show two major peaks corresponding to the $2p_{3/2}$ and $2p_{1/2}$, each followed by a satellite peak. As shown in FIG. 4B, the 2p peaks are best fit with three Gaussian curves for both Ni and Co suggesting the presence of three different chemical environments. For Ni, the appearance of a peak at 852.6 eV suggests that some of the patterned Ni is in a metal-like environment. The major peak is at 855.6 eV, however, indicating that most of the Ni exists as $Ni(OH)_2$. This oxidation is expected since the patterning was performed under ambient conditions and the ink solution contained $H_2O$. Also, $Ni(OH)_2$ is easily oxidized to oxyhydroxide (NiOOH) in the presence of water, thus explaining the minor peak at 857.2 eV. Similar behavior is expected for Co, and this explains the peak at 783.7 eV which can be attributed to CoOOH. Additionally, the Co exists in a metal-like environment as evidenced by the peak at 778.4 eV, however, the majority is in hydroxide form as suggested by the main peak at 781.1 eV.

The composition ratio of Ni—Co was analyzed using energy-dispersive X-ray spectroscopy (EDS) and XPS. EDS data reveals a 3.56:1 ratio of Ni:Co (atomic wt %) in the printed structures (FIG. 3) while XPS analysis based on the area of the $2p_{3/2}$ peaks results in a similar Ni:Co ratio of 3.86:1. Due to the different reduction potentials of Ni and Co, the composition ratio can be tuned by changing the applied voltage (Table 2 below). An increase in Ni content is observed as a more negative potential is applied. Another approach to control composition of deposited materials is to inject a gradient of inks across a single hydrogel pen array. With either of these methods, systems of the disclosure can be used to create a compositional variation of alloys across a single substrate.

TABLE 2

Chemical composition of Ni—Co deposited alloys as obtained by XPS.

| Ratio Ni:Co | Applied Potential (mV) | Ni % at/at | Co % at/at |
|---|---|---|---|
| 10:1 | −525 | 77.3 | 22.7 |
| 10:1 | −550 | 79.4 | 20.6 |
| 10:1 | −575 | 81.1 | 18.9 |
| 1:1 | −525 | 38.5 | 61.5 |
| 1:1 | −550 | 40.9 | 59.1 |
| 1:1 | −575 | 41.7 | 58.3 |

Example 3: Leveling

The system in accordance with embodiments of the disclosure allowed for optical leveling of the pen arrays. Optical leveling can be performed in accordance with previous techniques. F. Huo, Z. Zheng, G. Zheng, L. R. Giam, H. Zhang, C. A. Mirkin, Science 2008, 321, 1658. The system in accordance with the disclosure was determined to be beneficial in allowing for optical leveling and the ability for uniform patterning. This is believed to be attributable to the use of the transparent conductive rigid substrate on the pen arrays, together with the rigid support that holds the pen array, electrolyte solution, and reference electrode together above the substrate to be patterned.

Comparative Example 1: Leveling

Figure 14:
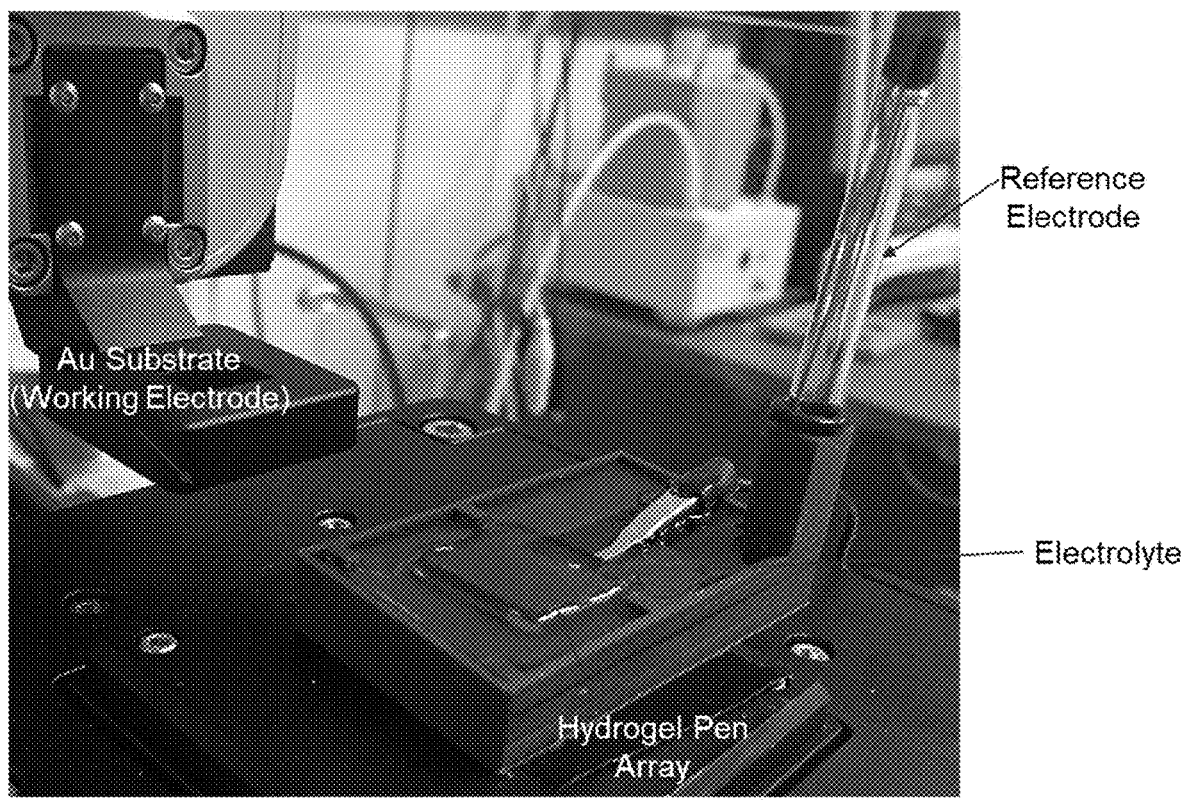
FIG. 14 is a photograph of an experimental set-up for leveling in accordance with comparative example 1.

A hydrogel pen array was attached to an ITO counter electrode and placed in an electrolyte bath connected to the reference electrode (FIG. 14). Uniform patterning could not be accomplished due to difficulty levelling the array with the substrate and determining the contact point of the hydrogel tips to the substrate.

First, the array could not be levelled optically when attempting to pattern inversely, nor the contact point detected, because the touch position of hydrogel pens with a transparent substrate could not be determined. The hydrogel is transparent and, without a reflective layer, it does not create any shadows with which to determine when the tip has made contact with the substrate. Furthermore, it was difficult to level the arrays with sensitive force measurement as well. This is because the softness of the hydrogel prevents accurate and consistent force readings for either contact point detection or levelling.

Comparative Example 2: Leveling

Figure 15:
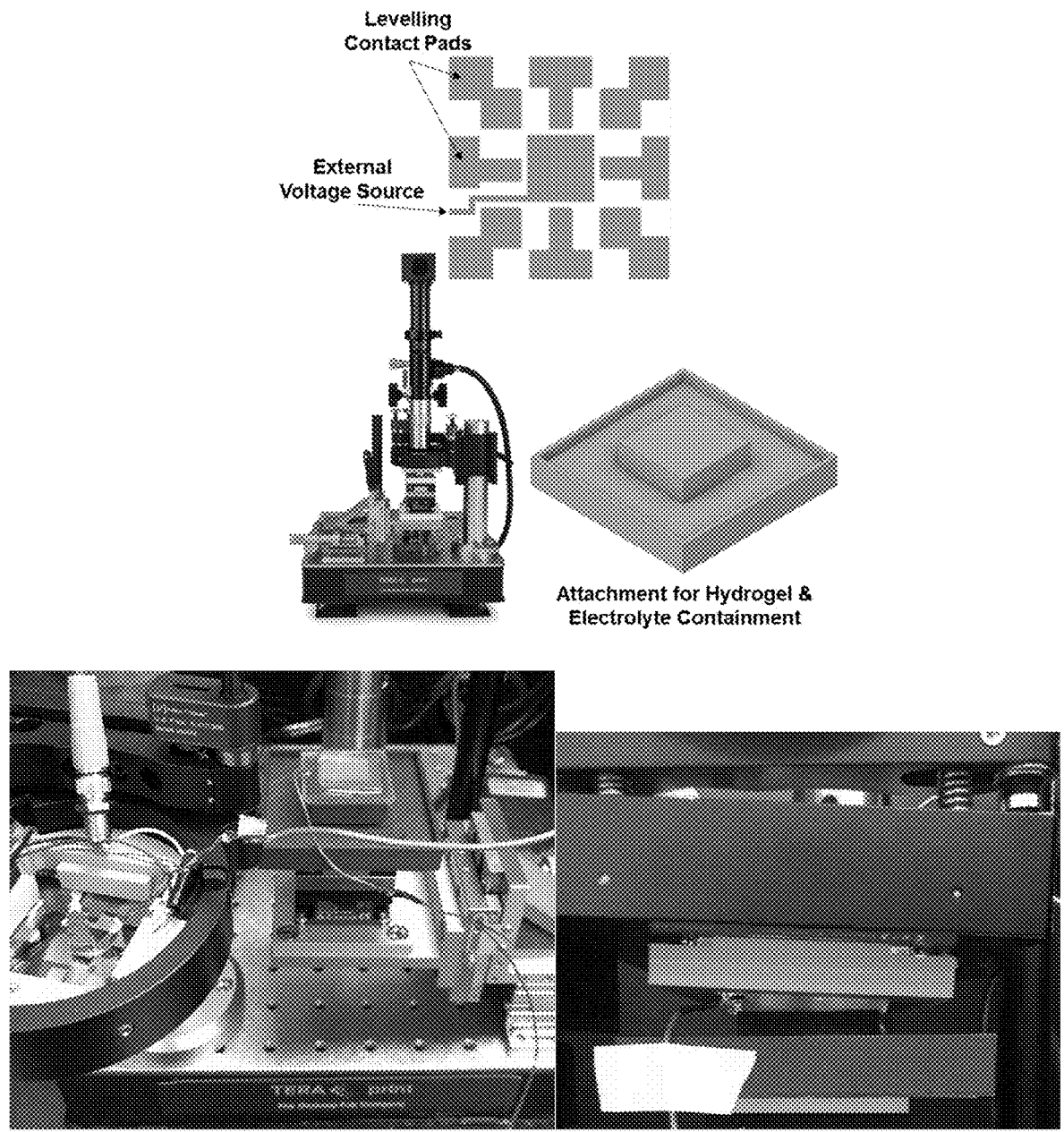
FIG. 15 is a photograph of an experimental set-up for leveling in accordance with comparative example 2.

In this experiment, the pen arrays were attempted to be leveled using electrical alignment in a TERA-Fab instrument. The experimental set-up used is shown in FIG. 15. This method used current detection between electrodes located on both the pen array and the substrate to determine when contact has been made across the array. While the hydrogel was conductive, the levelling process itself had inadvertent side effects, where deposition and etching occurred during levelling, which then disturbed the patterning process enough that it became impossible.

REFERENCES

[1] a) J. Zhu, L. Hu, P. Zhao, L. Y. S. Lee, K.-Y. Wong, Chem. Rev. 2020, 120, 851; b) J. Boken, P. Khurana, S. Thatai, D. Kumar, S. Prasad, Appl. Spectrosc. Rev. 2017, 52, 774; c) E. G. C. Neiva, M. M. Oliveira, L. H. Marcolino, A. J. G. Zarbin, J. Colloid Interface Sci. 2016, 468, 34; d) O. Vazquez-Mena, T. Sannomiya, L. G. Villanueva, J. Voros, J. Brugger, ACS Nano 2011, 5, 844.

[2] a) E. J. Kluender, J. L. Hedrick, K. A. Brown, R. Rao, B. Meckes, J. S. Du, L. M. Moreau, B. Maruyama, C. A. Mirkin, Proc. Natl. Acad. Sci. U.S.A. 2019, 116, 40; b) L. Huang, P.-C. Chen, M. Liu, X. Fu, P. Gordiichuk, Y. Yu, C. Wolverton, Y. Kang, C. A. Mirkin, Proc. Natl. Acad. Sci. U.S.A. 2018, 115, 3764.

[3] a) N. K. Mahenderkar, Q. Chen, Y.-C. Liu, A. R. Duchild, S. Hofheins, E. Chason, J. A. Switzer, Science 2017, 355, 1203; b) Z. Yan, H. Sun, X. Chen, H. Liu, Y. Zhao, H. Li, W. Xie, F. Cheng, J. Chen, Nat. Commun. 2018, 9, 2373; c) G. H. A. Therese, P. V. Kamath, Chem. Mater. 2000, 12, 1195.

[4] a) L. Hirt, S. Ihle, Z. Pan, L. Dorwling-Carter, A. Reiser, J. M. Wheeler, R. Spolenak, J. Vörös, T. Zambelli, Adv. Mater. 2016, 28, 2311; b) J. Xu, W. Ren, Z. Lian, P. Yu, H. Yu, Int. J. Adv. Manuf. Technol. 2020, 110, 1731.

[5] a) Y. Li, B. W. Maynor, J. Liu, J. Am. Chem. Soc. 2001, 123, 2105; b) J. Hu, M.-F. Yu, Science 2010, 329, 313; c) L. Hirt, R. R. Grüter, T. Berthelot, R. Cornut, J. Vörös, T. Zambelli, RSC Adv. 2015, 5, 84517; d) S. K. Seol, D. Kim, S. Lee, J. H. Kim, W. S. Chang, J. T. Kim, Small 2015, 11, 3896; e) S. K. Seol, A. R. Pyun, Y. Hwu, G. Margaritondo, J. H. Je, Adv. Funct. Mater. 2005, 15, 934; f) H. Kang, S. Hwang, J. Kwak, Nanoscale 2015, 7, 994; g) C. Yun, H. Kang, J. Kwak, S. Hwang, ACS Omega 2019, 4, 14599; h) X. Chen, X. Liu, M. Ouyang, J. Chen, O. Taiwo, Y. Xia, P. R. N. Childs, N. P. Brandon, B. Wu, Sci. Rep. 2019, 9, 3973; i) A. Reiser, M. Lindén, P. Rohner, A. Marchand, H. Galinski, A. S. Sologubenko, J. M. Wheeler, R. Zenobi, D. Poulikakos, R. Spolenak, Nat. Commun. 2019, 10, 1853; j) D. Eliyahu, E. Gileadi, E. Galun, N. Eliaz, Adv. Mater. Technol. 2020, 5, 1900827.

[6] F. Huo, Z. Zheng, G. Zheng, L. R. Giam, H. Zhang, C. A. Mirkin, Science 2008, 321, 1658.

[7] a) K. A. Brown, D. J. Eichelsdoerfer, X. Liao, S. He, C. A. Mirkin, Frontiers of Physics 2014, 9, 385; b) R. D. Piner, J. Zhu, F. Xu, S. Hong, C. A. Mirkin, Science 1999, 283, 661; c) S. Rozhok, R. Piner, C. A. Mirkin, The Journal of Physical Chemistry B 2003, 107, 751.

[8] S. R. Ovshinsky, M. A. Fetcenko, J. Ross, Science 1993, 260, 176.

[9] M. Jana, P. Sivakumar, M. Kota, M. G. Jung, H. S. Park, J. Power Sources 2019, 422, 9.

What is claimed:

1. A hydrogel pen array system for electrochemical deposition, comprising:
    a rigid support comprising a pen array receiving area and a reference electrode reservoir in fluid communication with the pen array receiving area, the reference electrode reservoir adapted to contain a patterning composition and a reference electrode at least partially immersed in the patterning composition;

the pen array comprising a common hydrogel base layer having oppositely disposed first and second surfaces, a plurality of hydrogel pens fixed to the second surface of the common hydrogel base layer and extending outwardly therefrom, each of the plurality of pens comprising a base and an oppositely disposed tip, the base is fixed to the second surface of the common hydrogel base layer, and the tip has a radius of curvature of less than about 1 µm; and a rigid, transparent and conductive support attached to the first surface of common hydrogel base layer, wherein the pen array is disposed in the pen array receiving area such that the plurality of pens extends outwardly from the rigid support.

2. The hydrogel pen array of claim 1, wherein the hydrogel a polyacrylamide hydrogel or agarose.

3. The hydrogel pen array of claim 1, wherein each tip has a radius of curvature of less than about 100 nm.

4. The hydrogel pen array of claim 1, wherein the pens are arranged in a regular periodic pattern.

5. The hydrogel pen array of claim 1, wherein the pens are pyramidal.

6. The hydrogel pen array of claim 1, wherein the transparent, conductive, and rigid support is ITO-coated glass, FTO-coated glass, IZO-coated glass, PEDOT, or PEDOT:PSS.

7. The hydrogel pen array of any one of the preceding claim 1, wherein the transparent, conductive, and rigid support further comprises an adhesive monolayer disposed between a conductive surface and the base of the pens.

8. The hydrogel pen array of claim 7, wherein the adhesive monolayer is acrylamide.

9. A hydrogel pen array system for electrochemical deposition, comprising:

a pen array comprising a common hydrogel base layer having oppositely disposed first and second surfaces, a plurality of hydrogel pens fixed to the second surface of the common hydrogel base layer and extending outwardly therefrom, each of the plurality of pens comprising a base and an oppositely disposed tip, the base is fixed to the second surface of the common hydrogel base layer, and the tip has a radius of curvature of less than about 1 µm a rigid support comprising:

a pen array receiving area comprising a plurality of walls defining an internal volume and oppositely disposed first and second openings formed in oppositely disposed ones of the plurality of walls, wherein the pen array is disposed in the pen array receiving area such that the common hydrogel base layer is disposed in the internal volume, a portion of the first surface of the common hydrogel base layer is exposed through the first opening, and the plurality of pens extends outwardly through the second opening away from the pen array receiving area, and a reference electrode reservoir in fluid communication with the internal volume of the pen receiving area, the reference electrode reservoir adapted to be at least partially filled with a patterning composition and to receive a reference electrode such that it is partially immersed in the patterning composition; and a transparent, conductive, and rigid support attached to the portion of the first surface of the common hydrogel base layer exposed through the first opening.

10. The hydrogel pen array of claim 9, wherein the hydrogel a polyacrylamide hydrogel or agarose.

11. The hydrogel pen array of claim 9, wherein the transparent, conductive, and rigid support is ITO-coated glass, FTO-coated glass, IZO-coated glass, PEDOT, or PEDOT:PSS.

12. A method of leveling a hydrogel pen array system of claim 1, comprising:

filling the reference electrode reservoir with the patterning composition, the patterning composition comprising a metal salt solution, and immersing the reference electrode in the patterning composition;

contacting the pen array with a working electrode;

observing the contact of the pens with the working electrode with an optical microscope through the rigid, transparent, and conductive support; and tilting one or both of the pen array or the working electrode with respect to one another to align the pens;

wherein the reference electrode and the hydrogel pen array are maintained by the rigid support above the working electrode during alignment.

13. A method of printing metal indicia on a conductive substrate by electrochemical deposition using the hydrogel pen array system of claim 1, comprising immersing the hydrogel pen array in a patterning composition, the patterning composition comprising a metal salt in solution under conditions sufficient to allow the metal salt to diffuse into the pens; and contacting the conductive substrate with the tips of the pens and applying a voltage while the tips are in contact with the conductive substrate to thereby reduce the metal salt diffused in the pens and deposit the metal indicia on the conductive substrate.

14. The method of claim 13, wherein the patterning composition comprises two or metal salts.

15. The method of claim 13, wherein immersing the hydrogel pen array in the patterning composition comprises immersing for about 3 hours to about 48 hours.

16. The method of claim 13, further comprising repeatedly contacting the conductive substrate with the tips of the pens and applying the voltage to thereby deposit further metal layer on the metal indicia.

17. A method of leveling a hydrogel pen array system of claim 9, comprising:

filling the reference electrode reservoir with the patterning composition, the patterning composition comprising a metal salt solution, and immersing the reference electrode in the patterning composition;

contacting the pen array with a working electrode;

observing the contact of the pens with the working electrode with an optical microscope through the rigid, transparent, and conductive support; and tilting one or both of the pen array or the working electrode with respect to one another to align the pens;

wherein the reference electrode and the hydrogel pen array are maintained by the rigid support above the working electrode during alignment.

18. A method of printing metal indicia on a conductive substrate by electrochemical deposition using the hydrogel pen array system of claim 9, comprising immersing the hydrogel pen array in a patterning composition, the patterning composition comprising a metal salt in solution under conditions sufficient to allow the metal salt to diffuse into the pens; and contacting the conductive substrate with the tips of the pens and applying a voltage while the tips are in contact with the conductive substrate to thereby reduce the metal salt diffused in the pens and deposit the metal indicia on the conductive substrate.

19. The method of claim 18, wherein the patterning composition comprises two or metal salts.

\* \* \* \* \*